(12) United States Patent
Holscher

(10) Patent No.: US 6,423,474 B1
(45) Date of Patent: Jul. 23, 2002

(54) USE OF DARC AND BARC IN FLASH MEMORY PROCESSING

(75) Inventor: Richard D. Holscher, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/532,666

(22) Filed: Mar. 21, 2000

(51) Int. Cl.⁷ .................................................. G03F 7/00
(52) U.S. Cl. ....................... 430/312; 430/311; 430/314; 430/330; 430/950
(58) Field of Search .............................. 430/311, 312, 430/314, 330, 950

(56) References Cited

U.S. PATENT DOCUMENTS 5,986,318 A * 11/1999 Kim et al. .................. 257/437
5,990,002 A * 11/1999 Niroomand et al. ......... 438/636
5,994,217 A * 11/1999 Ng .............................. 438/636
6,169,029 B1 * 1/2001 Yang ........................... 438/671

FOREIGN PATENT DOCUMENTS

JP        09-222726 A    *   8/1997

* cited by examiner

Primary Examiner—Mark F. Huff
Assistant Examiner—Nicole Barreca
(74) Attorney, Agent, or Firm—Knobbe, Martens, Olson & Bear, LLP

(57) ABSTRACT

A method of using dielectric anti-reflective coating (DARC) in conjunction with bottom anti-reflective coating (BARC) to form an anti-reflective barrier layer is provided. The anti-reflective layer conforms to the topography of the substrate surface and is adapted to function effectively in both annealed and unannealed states. The method of using DARC in combination with BARC also inhibits the nitride layer of a gate stack to seep into adjacent photoresist layers and adversely affect the composition of the photoresist.

29 Claims, 3 Drawing Sheets

USE OF DARC AND BARC IN FLASH MEMORY PROCESSING

BACKGROUND OF THE INVENTION

1. Field of the Invention

This invention relates to integrated circuit processing and, more particularly, to a method of using dielectric anti-reflective coating (DARC) in conjunction with bottom anti-reflective coating (BARC) to form an anti-reflective barrier layer that conforms to the topography of the substrate surface and is tuned to function effectively in both annealed and unannealed states.

2. Description of the Related Art

The typical semiconductor process involves implanting or depositing regions or layers of different material either into or on different regions of a semiconductor substrate. To ensure that the material is positioned at the correct location on the semiconductor substrate, a photo imaging process is typically used to define the regions that are to subsequently receive the material. The conventional photo imaging process, known as photolithography, generally involves projecting light waves onto a photoresist surface so that the light can react with the photoresist to create an imaged pattern. The photoresist can then be selectively removed as a result of the exposure such that a region of the semiconductor device is exposed to receive the additional material.

In some cases the light waves are known to propagate through the photoresist, reach the underlying substrate, and reflect from the substrate surface back through the photoresist. The reflected light can interfere with other waves propagating through the photoresist and ultimately reduce the accuracy and precision of the image transferred. In particular, the reflected light can interfere and scatter light waves that are being directed towards a particular region of the photoresist which in turn reduces the effectiveness of exposure intended for the region. As a consequence, the region of the photoresist may not be as uniformly exposed and selective removal of the photoresist during subsequent processing steps may be affected. Furthermore, light reflected from the substrate surface can scatter, especially if the substrate surface is non-planar, such that the scattered light can inadvertently expose the photoresist surrounding the desired region of the photoresist. Hence, the reflected light can expose regions of the photoresist that should otherwise remain unexposed which limits the ability to precisely define regions of the photoresist for selective removal.

To address this particular problem associated with the photo imaging process, anti-reflective coatings are commonly used to attenuate or absorb the light waves reflected from the substrate surface during photo exposure operations. Anti-reflective coatings are materials generally known for their ability to absorb various wavelengths of radiation. They are typically interposed between the substrate surface and the photoresist so as to serve as a barrier that inhibits the reflected waves from traversing back through the photoresist and adversely affecting the imaging process. Dielectric anti-reflective coating (DARC) and bottom anti-reflective coating (BARC) are examples of anti-reflective materials that are commonly used to absorb radiation reflected from the substrate surface during the photo imaging operations of integrated circuit processing.

In particular, BARC is generally available as a low-viscosity liquid that can be applied onto the substrate surface using a well known spin coating process. Disadvantageously, however, BARC cannot be universally applied to all substrate surfaces. The relatively low viscosity of BARC and inherent limitations of the spin coating process render BARC inadequate in covering substrate surfaces with a substantially contoured topography. In particular, BARC is known to accumulate or pool in recessed regions on a non-planar surface while leaving most high profiled areas on the substrate exposed. Furthermore, BARC is known to vaporize under high temperature conditions that are characteristic of most annealing operations and therefore is typically rendered useless following high temperature annealing.

To address this problem associated with BARC, dielectric anti-reflective coating (DARC) is often used in place of BARC for substrates having a contoured topography or for substrates that are subjected to high temperature annealing. DARC is chosen largely for its ability to conform to the contours of the substrate surface and its ability to withstand the typical annealing operation. Furthermore, it is generally known that the composition of DARC can be adjusted or tuned to function effectively in either annealed or unannealed states Disadvantageously, however, DARC that is adjusted to function effectively in an annealed state tends to be ineffective before being unannealed. Likewise, DARC that is tuned to work effectively before annealing usually loses its anti-reflective properties after high temperature annealing. Consequently, more than one layer of DARC is generally applied to substrates that undergo high temperature annealing between successive photo imaging steps. However, the formation of multiple layers of DARC onto the substrate surface typically involves repeatedly exposing the substrate to high temperature conditions that are characteristic of most DARC deposition methods. It can be appreciated that subjecting substrates to multiple thermal sequences is not only costly and time consuming but also can increase the occurrence of defects in the substrate.

Hence, from the foregoing, it will be appreciated that there is a need for a method of inhibiting light waves from reflecting back through the photoresist during photo exposure operations such that the method can be applied universally to most substrate surfaces and is not affected by thermal cycling. To this end, there is a particular need for an anti-reflective barrier layer that substantially conforms to the topography of the substrate surface and is adapted to function effectively in both annealed and unannealed states.

SUMMARY OF THE INVENTION

The aforementioned needs are satisfied by the method of the present invention which uses dielectric anti-reflective coating (DARC) in conjunction with bottom anti-reflective coating (BARC) to form an anti-reflective barrier layer that substantially conforms to the topography of the substrate surface and is tuned to function effectively in both annealed and unannealed states.

In one aspect, this invention comprises a method of forming an anti-reflective barrier layer on a substrate surface wherein a layer of DARC is first formed on an upper surface of the substrate and a layer of BARC is subsequently formed on an upper surface of the DARC layer. Preferably, the DARC layer substantially conforms to the topography of the substrate surface and provides a surface that is adapted to receive the BARC layer. Preferably, the composition of DARC is adjusted in a manner such that its anti-reflective properties are optimized after undergoing high temperature annealing while the BARC is selected for its ability to absorb light waves before annealing. In one embodiment, the composition of DARC comprises silicon, oxygen, nitrogen and the composition of BARC comprises organic polymers made of carbon, oxygen, and nitrogen. However, it can be appreciated that a variety of other formulations of DARC and BARC can be used without departing from the scope of the present invention.

In another aspect of this invention, the method of using DARC in conjunction with BARC as a barrier layer is adapted to attenuate reflected radiation generated during the photo imaging operations of FLASH memory circuit processing. In particular, the FLASH memory circuit processing typically involves the formation of a gate stack which typically comprises high temperature annealing operations interposed between multiple print and etch steps. As such, it is desirable to form a barrier layer that functions as an effective anti-reflective coating during photo imaging operations both before and after annealing.

In one embodiment, a layer of DARC is formed on an upper surface of a nitride cap layer of a conventional gate stack for FLASH memory circuits. Preferably, the DARC is deposited onto the nitride cap using a well known chemical vapor deposition process and substantially conforms to the topography of the nitride cap as well as all other features on the substrate surface. Furthermore, a layer of BARC is subsequently formed on an upper surface of the DARC layer using a well known spin coating process. Preferably, the BARC layer serves as an effective anti-reflective coating under pre-annealing conditions while the DARC layer is tuned for post-annealing uses. Furthermore, the DARC layer is formed adjacent to the substrate surface as it is able to conform to the surface topography of the gate stack. Advantageously, the DARC and BARC layers are selected and used in a complementary fashion so that they compensate for each other's deficiencies and form a barrier layer that retains the advantages of both materials.

Furthermore, the anti-reflective barrier layer comprising DARC and BARC is preferably interposed between the nitride cap of the gate stack and a layer of subsequently deposited photoresist used for a first photo imaging and patterning operation. In particular, the BARC layer is adapted to inhibit the reflected light waves generated from the first photo imaging operation from traversing back through the photoresist and affect the image transferred. Furthermore, subsequent to the first print and etch operation, the BARC is removed and the gate stack undergoes a high temperature annealing process. Preferably, the remaining DARC layer that is tuned to function in an annealed state will be used to attenuate reflected light waves that are generated from photo imaging operations following the annealing process.

In yet another aspect of the invention, the method of using DARC in conjunction with BARC provides an effective barrier that inhibits the nitride layer of the gate stack from seeping into the adjacent photoresist layer and poisoning the photoresist. Poisoning is known to occur when base chemicals from the nitride seep into the photoresist and neutralize the acids in the photoresist. The depletion of acids in the photoresist is known to cause incomplete development of photoresist and leave behind what is commonly known as a photoresist foot. In the preferred embodiment, a barrier layer comprising of DARC and BARC is interposed between the nitride cap and the photoresist so as to inhibit bases from the underlying nitride layer to seep into the adjacent photoresist layer and neutralize the acids in the photoresist. Advantageously, the barrier layer effectively inhibits the undesirable formation of photoresist foot.

In another aspect of the invention, a method of patterning and etching a semiconductor circuit is provided. The method comprises forming an anti-reflection barrier on the semiconductor circuit that has a first component tuned to absorb reflected light from the semiconductor circuit in an unannealed state and a second component tuned to absorb reflected light from the semiconductor surface in an annealed state. The method also comprises positioning a first photoresist layer on the anti-reflective barrier and then patterning and etching the first photoresist layer. The first component in combination with the second component of the anti-reflective barrier inhibit light from being reflected from the semiconductor device into the first photoresist layer during patterning and etching of the first photoresist layer. The method also comprises annealing the semiconductor circuit following the patterning and etching of the first photoresist layer wherein the annealing step improves the ability of the second component of the anti-reflective barrier to inhibit reflected light from travelling therethrough. The method further comprises depositing a second photoresist layer on the anti-reflective barrier and patterning and etching the second photoresist layer wherein the second component of the anti-reflective barrier inhibits light from being reflected from the semiconductor device into the second photoresist layer during patterning and etching of the second photoresist layer.

In another aspect the invention comprises a method of inhibiting light from reflecting off of an exposed surface of a semiconductor device during patterning and etching. In this aspect, the method comprises positioning a first barrier layer on the exposed surface of the semiconductor device wherein the first barrier layer is configured to inhibit light from reflecting from the exposed surface of the semiconductor layer. The method further comprises positioning a second barrier layer on the first barrier layer wherein the second barrier layer is configured to inhibit light from reflecting from the exposed surface of the semiconductor device. The method then comprises positioning a first photoresist layer on the second barrier layer and patterning and etching the first photoresist layer. The second barrier layer decreases the amount of reflected light reflecting from the exposed surface from entering the first photoresist layer during patterning and etching of the first photoresist layer. The method further comprises transforming the first barrier layer by annealing the semiconductor device so as to improve the ability of the first barrier layer to prevent light from being reflected from the exposed surface of the semiconductor device into a subsequently deposited photoresist layer during patterning and etching of the subsequently formed layers.

From the foregoing, it will be appreciated that the aspects of the present invention provide a method of forming an anti-reflective barrier layer comprising DARC and BARC onto a substrate surface of an integrated circuit assembly so that the barrier layer is able to withstand high temperature annealing, conforms to the substrate surface and is more effective in absorbing reflected light waves generated from the photo imaging operations both before and after annealing. Furthermore, the present invention provides, in one aspect, an effective barrier layer in inhibiting base chemicals from the nitride layer of a gate stack from seeping into adjacent photoresist layers and undesirably neutralize the acids in the photoresist. These and other objects and advantages of the present invention will become more apparent from the following description taken in conjunction with the following drawings.

DETAILED DESCRIPTION OF THE PREFERRED EMBODIMENTS

References will now be made to the drawings wherein like numerals refer to like parts throughout. As will be described herein below, the process of the preferred embodiment provides a method of using dielectric anti-reflective coating (DARC) in conjunction with bottom anti-reflective coating (BARC) to form on a substrate surface a light absorbing barrier layer that substantially conforms to the topography of the substrate surface and is adapted to attenuate light transmission both before and after high temperature annealing.

Figure 1:
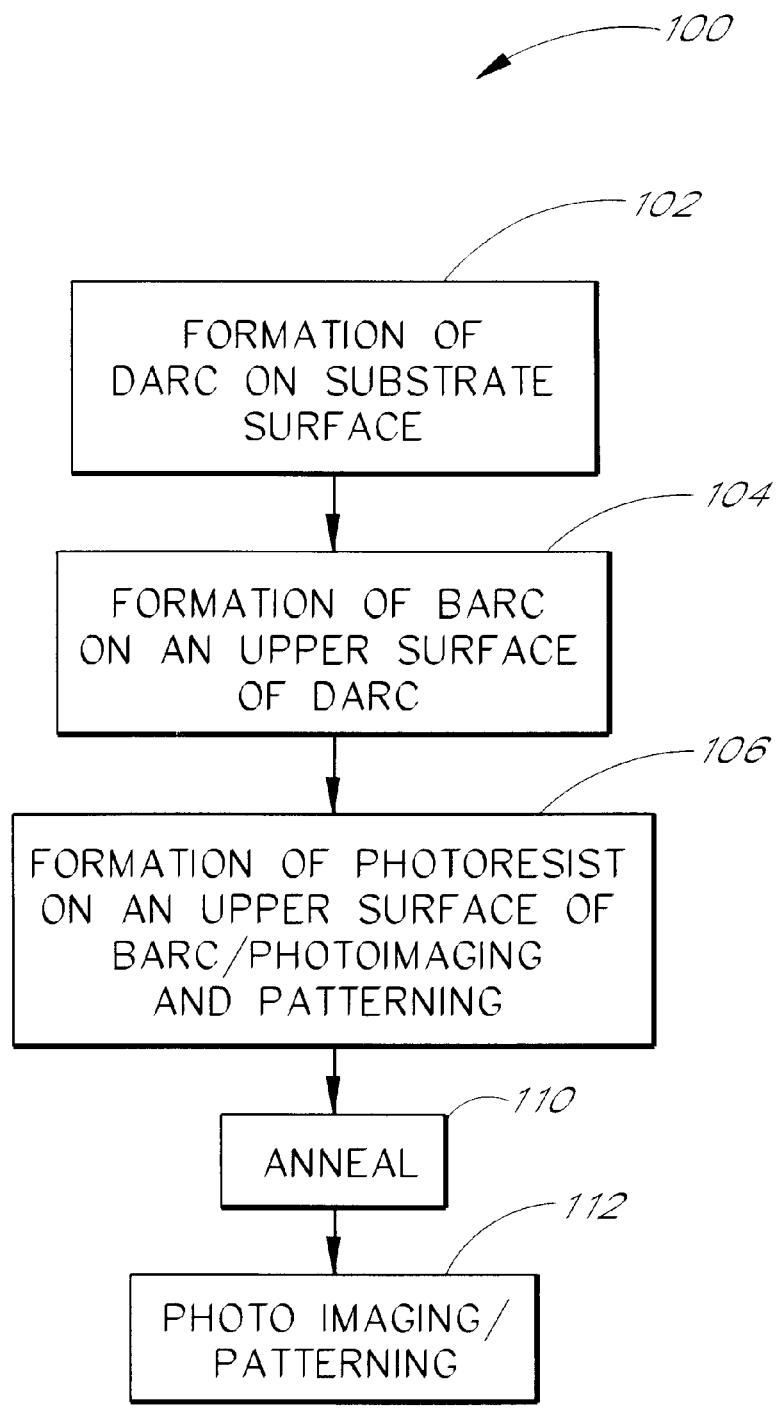
FIG. 1 is a flow diagram illustrating a process for forming a DARC and BARC barrier on an upper surface of a gate stack for a FLASH memory circuit, in accordance with one embodiment of the present invention.

FIG. 1 schematically illustrates a process flow 100 of the preferred embodiment of using DARC in conjunction with BARC to form an anti-reflective barrier layer that substantially conforms to the substrate surface and is adapted to function in both annealed and unannealed states. As shown in FIG. 1, the process begins with a first step 102 comprising the formation of a layer of DARC onto a substrate surface. The substrate surface can comprises an insulating, conductive, or semiconductive material that is commonly used in integrated circuit processing and the topography of the substrate surface can be flat or contoured. As will be described in greater detail below, in this embodiment, the substrate surface comprises an upper surface of a conventional gate stack for FLASH memory circuits, however, it will be appreciated that the process can be used during formation of any of a number of different semiconductor circuits without departing from the spirit of the present invention. Preferably, the layer of DARC is deposited onto the substrate surface using a well known chemical vapor deposition (CVD) process. In particular, DARC is deposited in a manner such that the coating substantially conforms to the contours of the substrate surface.

Furthermore, the composition of DARC can be adjusted or tuned in accordance with the subsequent processing conditions. In particular, the percentage of each component comprising DARC is typically tuned to optimize its anti-reflective properties in either an annealed or unannealed state. Disadvantageously, however, DARC layers that are adjusted for optimum performance in an unannealed state are generally less effective in absorbing reflected radiation after having undergone an annealing process. Similarly, DARC layers that are tuned to withstand high temperature annealing are often less effective in absorbing reflected radiation in an unannealed state. Furthermore, there is no known DARC material that is capable of functioning as an effective anti-reflective barrier layer in both annealed and unannealed states. Consequently, multiple layers of DARC with different compositions are typically required in the prior art for most integrated circuit processing that involves photo imaging operations both before and after high temperature annealing.

Advantageously, the process of the preferred embodiment reduces the need of applying multiple layers of DARC that are specifically formulated to function in annealed or unannealed states. As will be described in greater detail below, the present invention provides a method of using DARC in conjunction with another anti-reflective material having complementary characteristics so that the resulting barrier layer retains the combined advantage of both materials. As such, the present method effectively eliminates the need of applying multiple layers of DARC to the substrate and thus reduces the substrate's exposure to high temperature deposition processes.

As it is shown in FIG. 1, following the formation of the DARC layer, a second step 104 of the process 100 comprises forming a layer of bottom anti-reflective coating (BARC) on an upper surface of the DARC layer. BARC is also commonly used to inhibit the reflection of light from the substrate surface during photo imaging operations. Unlike DARC, however, BARC is generally available as a low-viscosity liquid and is typically spin coated onto the substrate surface.

While BARC possesses favorable anti-reflective properties, it has limited applications because of its relatively low viscosity. As such, BARC is an effective anti-reflective coating only when it is in an unannealed state as the high temperature condition during typical annealing operations will substantially vaporize the BARC layer. Furthermore, BARC is known to be ineffective in covering substrate surfaces having a contoured topography. In particular, BARC is known to pool near recessed areas on a contoured surface and thus leaving high profiled areas on the substrate exposed. To inhibit the pooling effect, the BARC layer of the preferred embodiment is spin coated onto the generally planar upper surface of the underlying DARC layer so that the coating of BARC will not be affected by the underlying surface topography and can thus be applied to mostly all substrates. As such, in this embodiment, the disadvantages commonly associated with BARC is minimized by the particular method in which BARC is used in conjunction with DARC.

As FIG. 1 further shows, following the deposition of the BARC layer, a layer of photoresist is formed, in state 106, on an upper surface of the BARC layer for subsequent photo imaging operation. The conventional photo imaging operation entails exposing selected areas of the photoresist to radiation from a light source so as to form a desired pattern on the photoresist. Disadvantageously, the radiation can penetrate the photoresist layer, reach the underlying substrate surface, and subsequently reflect from the substrate surface back through the photoresist. As described in detail above, the reflected radiation can interfere with the light propagating through the photoresist and reduce the accuracy of the image. Therefore, the layers of DARC and BARC are preferably interposed between the underlying substrate and the photoresist so as to absorb light that has reflected back from the substrate surface, thereby inhibiting the light from traveling through the photoresist. Preferably, during the photo imaging operation of step 106, the BARC layer functions as an anti-reflective light absorber while the DARC layer is tuned to absorb light in an annealed state that will be described in greater detail below.

As FIG. 1 further shows, subsequent to photo imaging and patterning, the integrated circuit is annealed in a fourth step 110 of the process of the preferred embodiment. The annealing operation is commonly used in integrated circuit processing and typically entails subjecting the integrated circuit assembly to high temperature conditions in the range of 800 C. –1050 C. As is understood in the art, the annealing step 110 is typically performed for a reason unrelated to patterning and etching of the photoresist. Oftentimes, the photoresist deposited in step 106 is patterned and etched to permit selective deposition of additional material on selected regions of the semiconductor device. Subsequently, the annealing step 110 may be used to transform subsequently deposited or implanted material into more desired device material. Following the annealing step, additional patterning and etching steps may be used to continue the formation of the semiconductor device which will require the use of the DARC layer that is tuned to the particular anneal step 110.

As described in detail above, the BARC layer will typically vaporize during annealing leaving the layer of DARC on the substrate surface. Alternatively, the BARC layer may be removed following removal of the photoresist in the first patterning and etching step 106 in a well-known manner. As such, the remaining DARC layer that is tuned to absorb light in an annealed state will serve as an anti-reflective layer for photo imaging operations subsequent to annealing.

As FIG. 1 further shows, following the annealing operation 110, a fifth step 112 of the preferred embodiment involves a second photo imaging and patterning operation. During the second photo imaging operation 112 that occurs after annealing, the DARC layer serves as the anti-reflective layer and inhibits light from being transmitted to the underlying substrate layers. Thus, the present method of using DARC and BARC provides an anti-reflective barrier layer that is functional in both annealed and unannealed states, thus reducing the disadvantageous associated with applying multiple layers of DARC and the low viscosity nature of BARC.

Figure 2:
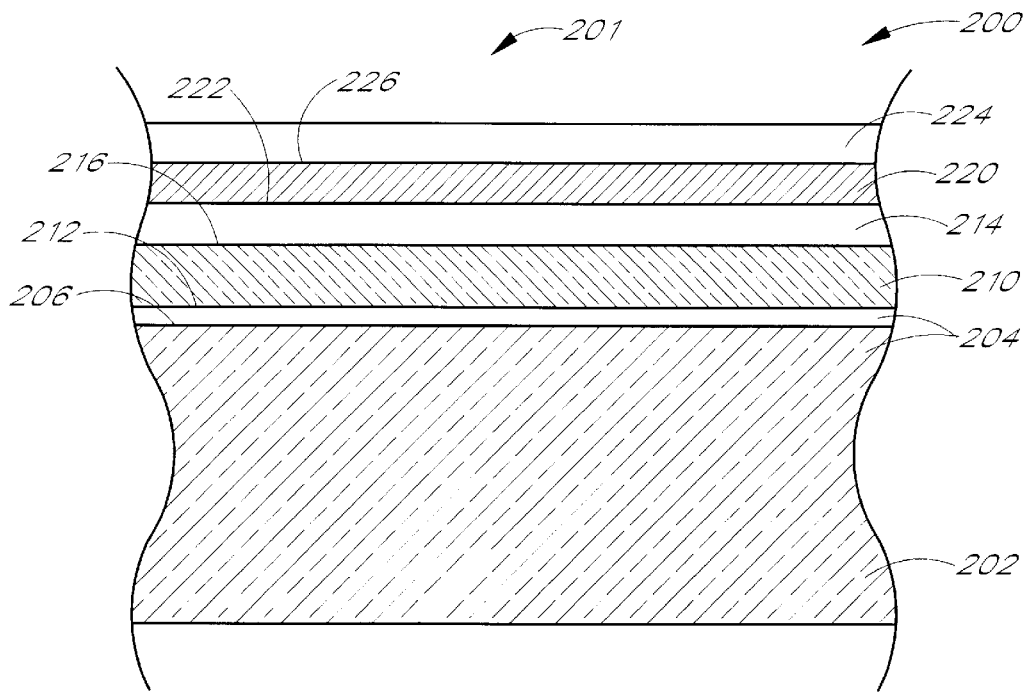
FIG. 2 is a partial, elevational, cross-sectional view of a partially fabricated integrated circuit or substrate assembly, showing a conventional gate stack used for FLASH memory circuit.

FIG. 2 illustrates a typical partially fabricated integrated circuit or substrate assembly 200 which includes a structure formed above a substrate 202. The substrate 200 may comprise a single crystal wafer or other semiconductive layer in which active or operable portions of the electrical devices are formed. In particular, the substrate assembly 200 of the illustrated embodiment represents a gate stack 201 of a FLASH memory circuit formed on a substrate 202. As FIG. 2 further illustrates, the gate stack 201 comprises a gate oxide layer 204 that is formed on an upper surface 206 of the semiconductor substrate 202 using well known gate oxide growth techniques, such as dry/wet/dry or dry only oxidation, so as to form a gate oxide of a predetermined thickness.

Subsequently, a conductive layer 210 is formed in an upper surface 212 of the gate oxide layer 204. In this embodiment, a conductive polysilicon layer 210 is formed on the upper surface 212 of the gate oxide 204 using well-known polysilicon deposition techniques such as LPCVD. As is also shown in FIG. 2, the gate stack 200 further comprises a metal layer 214 that is formed on an upper surface 216 of the conductive polysilicon layer 210. In one embodiment, the metal layer 214 comprises tungsten silicide (WSix) and is deposited using a method well known in the art.

As FIG. 2 further illustrates, a layer of isolation material 220 is formed on an upper surface 222 of the metal layer 214. In this embodiment, the isolation material 220 comprises an oxide such as Low Silane Oxide (LSO) that is formed using well known deposition methods such as chemical vapor deposition (CVD). In the embodiment as shown in FIG. 2, the gate stack 200 further comprises a cap layer 224 that is formed on an upper surface 226 of the isolation layer 220. Preferably, the cap layer 224 comprises a layer of nitride that is formed using a well known deposition method such as chemical vapor deposition (CVD).

It will be appreciated that the various layers of material defining the gate stack 201 are formed of a material that has a composition and thickness that will vary depending upon the particular application. In this particular application the gate stack includes the oxide layer 204 with a polysilicon conductive layer 206 positioned over the oxide layer to permit electrical activation of a device (not shown) formed in the substrate. The metal WSix layer 206 is typically used as an address line to activate particular devices within the substrate and the isolation layer 220 is used to isolate the metal conductor from subsequently formed layers and devices formed on the semiconductor substrate 202. The exact configuration of the gate stack 201 will vary depending upon the particular circuit being formed and as discussed above the method of using the anti reflection coatings of the preferred embodiment can be accomplished with any of a number of variations in the gate stack 201.

Figure 3:
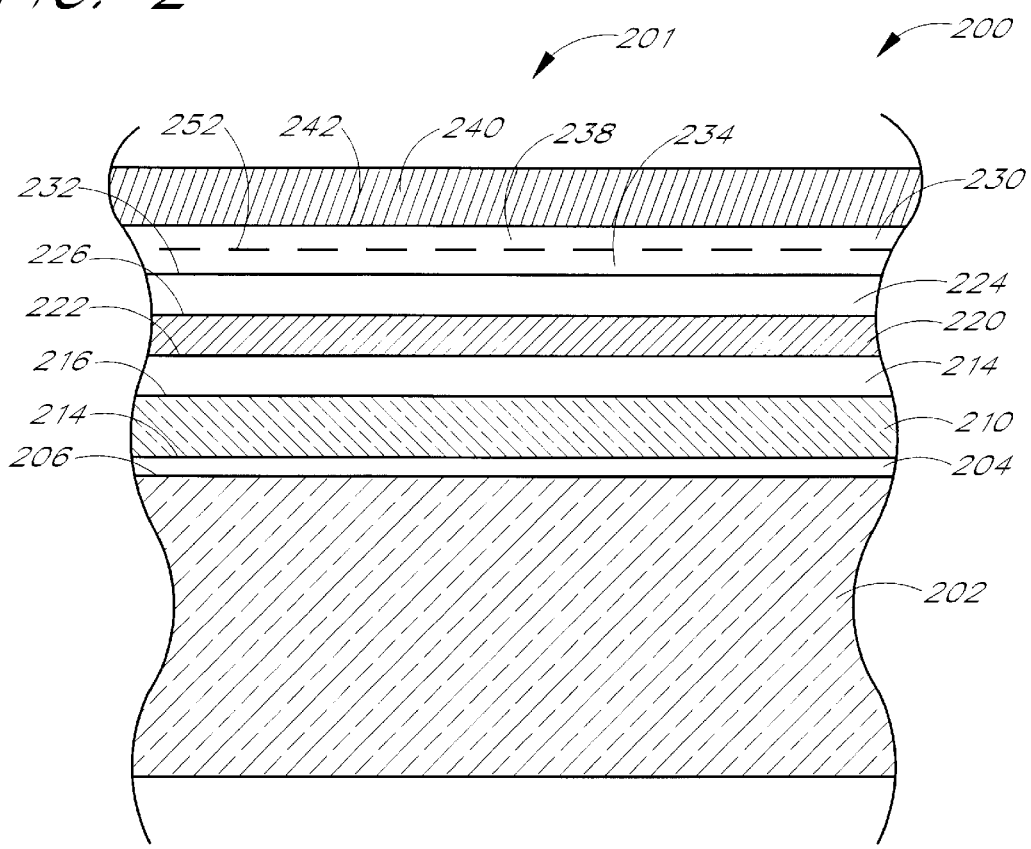
FIG. 3 is a partial, elevational, cross-section view of the substrate assembly of FIG. 2 illustrating an anti-reflective barrier layer comprising DARC and BARC that has been formed onto the nitride cap of the gate stack and a first photoresist layer that is formed on an upper surface of the BARC layer in preparation for a first photo imaging operation.

With reference to FIG. 3, an anti-reflective barrier layer 230 is formed on an upper surface 232 of the cap layer 224. As FIG. 3 shows, the anti-reflective barrier layer 230 comprises a film of dielectric anti-reflective coating (DARC) 234 combined with a film of bottom anti-reflective coating (BARC) 238. In one embodiment, the film of DARC 234 is first formed on the upper surface 232 of the nitride cap layer 224 using a well known chemical vapor deposition process (CVD). Preferably, the film of DARC 234 is deposited in such a manner as to substantially conform to the surface topography of the substrate assembly 200. Furthermore, the film of DARC 234 is formed to have a generally planar and even upper surface 252 for receiving the subsequent formation of BARC 238. Preferably, the layer of BARC 238 is formed on the upper surface 252 using a well known spin coating process. In contrast to DARC that is typically applied onto conventional substrate surfaces having various surface contours, the BARC layer of the preferred embodiment will be applied evenly across the DARC layer without pooling as the DARC layer has a generally flat upper surface 252. Advantageously, the present invention provides a novel method of using DARC 234 in conjunction with BARC 238 to form an anti-reflective barrier layer that can be universally applied to most substrate surfaces and is effective in both annealed and unannealed states.

FIG. 3 also shows that a layer of photoresist 240 is formed on an upper surface 242 of the BARC layer 238. Preferably, the photoresist is approximately 3,000 Å–10,000 Å thick and formed by a well known method such as spin coating. In one embodiment, a first photo imaging or patterning and etching operation follows the deposition of the photoresist layer 240. During the photo imaging operation, the BARC layer 238 that is interposed between the photoresist 240 and the nitride cap 224 is adapted to attenuate the reflected light waves so as to inhibit the reflected radiation from being transmitted to the photoresist layer 240 and adversely affect the exposed image. Preferably, the substrate is then patterned and etched in a well-known manner to complete the formation of the gate-stack 201 or to allow formation of other devices on the semiconductor substrate 202.

Figure 4:
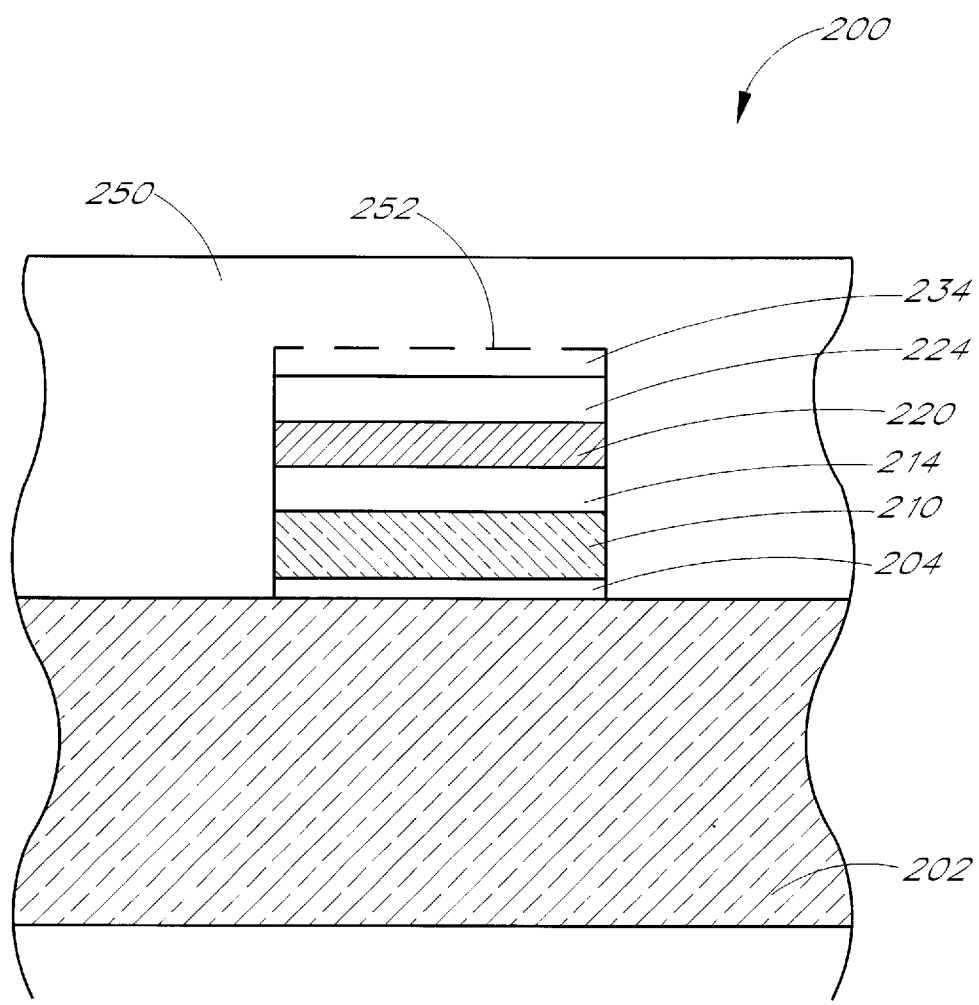
FIG. 4 is a partial, elevational, cross-section view of the substrate assembly of FIG. 3 illustrating the removal of the BARC layer after annealing and formation of a second photoresist layer on an upper surface of the DARC layer in preparation for a second photo imaging operation.

With reference to FIG. 4, subsequent to the first photo imaging and etch operations, the BARC layer is removed using a method known in the art such as a dry plasma process or wet clean, leaving the underlying DARC layer 234 exposed. Following the removal of the BARC layer, the substrate assembly 200 undergoes a high temperature annealing operation that is typically conducted at a temperature of approximately 800 C.–1050 C. As FIG. 4 further shows, a second layer of photoresist 250 is formed on the upper surface 252 of the DARC layer 234 subsequent to the annealing operation. The DARC layer 234 is formulated to inhibit light waves from reflecting from the underlying substrate 202 back through the second layer of photoresist 250. Furthermore, the DARC layer 234 also inhibits base chemicals from the nitride layer 224 from seeping through the photoresist and neutralize the acids in the photoresist so as to substantially reduce the undesirable occurrence of photoresist foot. Advantageously, the present invention provides a method of using DARC in conjunction with BARC in a complementary manner such that the two coatings form an anti-reflective barrier layer that can be universally applied to most substrate surfaces and is functional in both annealed and unannealed states.

Using a known simulation program such as SOLID-C, the applicant has determined the light reflectivity of an anti-reflective layer that is formed in accordance with the preferred embodiment. For comparison purposes, the program is also used to calculate the light reflectivity of commonly used anti-reflective coatings in annealed and unannealed states. In one aspect, results from the program suggest that the present method of using DARC in conjunction with BARC is a substantial improvement over the traditional method of using DARC alone.

In particular, the results indicate that an anti-reflective layer comprising approximately 475 Angstroms of unannealed DARC formulated with n value of 1.95 and k value of 0.53, wherein n represents the refractive index and k represents the extinction coefficient of the anti-reflective coating, and approximately 620 Angstroms of dielectric anti-reflective coating BARC DUV-32 has a light reflectivity of between approximately 0.02 and 0.03 when it is formed on the nitride surface that is approximately 250 Angstroms thick. The light reflectivity represents the fraction of light reflected in relation to the amount of light projected onto the semiconductor surface. Moreover, the simulation analysis shows that the light reflectivity of the DARC substantially improves after high temperature annealing and subsequent vaporization of the BARC. In particular, the Applicant's simulation data predicts a reflectivity of less than approximately 0.01 after the annealing step for this particular DARC compound. However, the same results show that a conventional anti-reflective layer comprising 475 Angstroms of DARC alone has a light reflectivity of approximately 0.04 in the unannealed state when it is formed on a substantially similar nitride surface. Therefore, it is apparent that the present method of using DARC in conjunction with BARC effectively provides a barrier layer that reflects approximately fifty percent less light in the unannealed state than the traditional anti-reflective layer but does not require the use of multiple DARC layer depositions known in the art.

Although the preferred embodiments of the present invention have shown, described and pointed out the fundamental novel features of the invention, as applied to these embodiments, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appended claims.

What is claimed is:

1. A method of patterning and etching a semiconductor surface, the method comprising:

forming an anti-reflective barrier on the semiconductor surface that has a first component tuned to absorb reflected light from the semiconductor surface in an unannealed state and a second component tuned to absorb reflected light from the semiconductor surface in an annealed state;

positioning a first photoresist layer on the anti-reflective barrier;

patterning and etching the first photoresist layer wherein the first component of the anti-reflective barrier inhibit light from being reflected from the semiconductor surface into the first photoresist layer during patterning and etching of the first photoresist layer;

annealing the semiconductor surface following the patterning and etching of the first photoresist layer wherein the annealing step improves the ability of the second component of the anti-reflective barrier to inhibit reflected light to pass therethrough;

depositing a second photoresist layer on the anti-reflective barrier;

patterning and etching the second photoresist layer wherein the second component of the anti-reflection barrier inhibits light from being reflected from the semiconductor surface into the second photoresist layer during patterning and etching of the second photoresist layer.

2. The method of claim 1, wherein forming an anti-reflection barrier comprises:

positioning a layer of DARC material on the semiconductor surface such that the DARC comprises the second component of the anti-reflection barrier; and positioning a layer of BARC on the layer of DARC material such that the BARC comprises the first component of the anti-reflection barrier.

3. The method of claim 2, further comprising removing the BARC following patterning and etching the first photoresist layer.

4. The method of claim 3, wherein removing the BARC comprises a dry plasma process.

5. The method of claim 2, wherein positioning the layer of DARC comprises positioning a layer of DARC material formulated with a refractive index of 1.95 and an extinction coefficient of 0.53.

6. The method of claim 2, wherein forming the anti-reflective barrier on the semiconductor surface comprises forming an anti-reflective barrier on a nitride layer wherein the nitride layer is approximately 250 Angstroms thick.

7. The method of claim 2, wherein positioning the layer of BARC comprises positioning a layer of BARC that is approximately 620 Angstroms thick.

8. The method of claim 2, wherein positioning the layer of DARC comprises positioning a layer of DARC formulated with a refractive index of 1.95 and an extinction coefficient of 0.53 that is approximately 475 Angstroms thick.

9. The method of claim 2, wherein positioning the layer of DARC comprises forming a layer of DARC that conforms to the semiconductor surface.

10. The method of claim 9, wherein positioning the layer of DARC comprises forming a layer of DARC using a chemical vapor deposition process.

11. The method of claim 2, wherein positioning the layer of BARC comprises forming a layer of BARC on a generally planar surface provided by the layer of DARC.

12. The method of claim 2, wherein positioning the layer of BARC comprises forming a layer of BARC using a spin coating process.

13. The method of claim 1, wherein forming the anti-reflective barrier comprises Conning an anti-reflective layer having a light reflectivity of between approximately 0.02 and 0.03, wherein the light reflectivity is the fraction of light reflected from the semiconductor surface in relation to the amount of light projected onto the semiconductor surface, following annealing the semiconductor surface.

14. A method of inhibiting light from reflecting off of an exposed surface of a semiconductor device during patterning and etching, the method comprising:

positioning a first barrier layer on the exposed surface semiconductor device wherein the first barrier layer is configured to inhibit light reflecting from the exposed surface of the semiconductor device from traveling therethrough;

positioning a second barrier layer on the first barrier layer wherein the second barrier layer is configured to inhibit light reflecting from the exposed surface of the semiconductor device from traveling therethrough before annealing;

positioning a first photoresist layer on the second barrier layer;

patterning and etching the first photoresist layer wherein the second barrier layer decreases the amount of reflected light reflecting from the exposed surface from entering the first photoresist layer during patterning and etching of the first photoresist layer;

transforming the first barrier layer by annealing the semiconductor device so as to improve the ability of the first barrier layer to prevent light from being reflected from the exposed surface of the semiconductor device into a subsequently deposited photoresist layer during patterning and etching of the subsequently deposited photoresist layer.

15. The method of claim 14, wherein positioning the first barrier layer comprises positioning a layer of DARC.

16. The method of claim 15, wherein positioning the layer of DARC comprises positioning a layer of DARC that is approximately 475 Angstroms thick.

17. The method of claim 16, wherein positioning the second barrier layer comprises positioning a layer of BARC that is approximately 620 Angstroms thick.

18. The method of claim 14, wherein positioning the second barrier layer comprises positioning a layer of BARC.

19. The method of claim 14, wherein transforming the first barrier layer by annealing the semiconductor device comprises transforming the light reflectivity of a layer of DARC to approximately 0.02 to 0.03, wherein the light reflectivity is the fraction of light reflected from the semiconductor device in relation to the amount of light projected onto the semiconductor device.

20. The method of claim 14, wherein positioning the first barrier layer on the exposed surface comprises positioning a layer of DARC on a nitride surface.

21. A method of forming an anti-reflective barrier layer on a semiconductive device, the method comprising:

forming a DARC layer that functions as an anti-reflective coating in an annealed state on a first surface of the device wherein the DARC layer substantially conforms to the topography of the first surface and has a substantially flat upper surface; forming a BARC layer that functions as an anti-reflective coating in an unannealed state on the upper surface of the DARC layer.

22. The method of claim 21 further comprising:

forming a first layer of photoresist on an upper surface of the BARC layer;

exposing the first layer of photoresist in a first photo imaging operation wherein the BARC layer is used to inhibit reflected light waves from traversing back through into the first layer of photoresist;

removing the layer of BARC;

annealing the substrate;

forming a second layer of photoresist on an upper surface of the DARC layer;

exposing the second layer of photoresist in a second photo imaging operation wherein the DARC layer is used to inhibit reflected light waves from traversing back through the second layer of photoresist.

23. The method of claim 22, wherein forming the DARC layer on a semiconductive device comprises forming the DARC layer on a first surface of a gate stack of a FLASH memory circuit.

24. The method of claim 21, wherein forming the DARC layer on a first surface comprises forming the DARC layer on a nitride layer.

25. A method of forming a FLASH memory circuit, the method comprising:

forming a gate stack on a substrate surface;

forming a layer of DARC that functions as an anti-reflective coating in an annealed state onto an upper surface of the gate stack;

forming a layer of BARC that functions as an anti-reflective coating in an unannealed state onto an upper surface of the DARC layer;

forming a first layer of photoresist on the upper surface of the BARC layer;

exposing the first layer of photoresist in a first print and etch operation;

removing the layer of BARC from the upper surface of the DARC layer;

annealing the gate stack;

forming a second layer of photoresist on the upper surface of the DARC layer;

exposing the second layer of photoresist in a second print and etch operation.

26. The method of claim 25, wherein removing the BARC layer comprises substantially removing the BARC using a wet clean process.

27. The method of claim 25, wherein forming the layer of DARC onto the upper surface of the gate stack comprises forming the layer of DARC onto a nitride layer.

28. The method of claim 25, wherein annealing the gate stack reduces the reflectivity of the DARC layer.

29. The method of claim 25, wherein forming the layer of DARC comprising forming a layer of DARC formulated with a refractive index of 1.95 and an extinction coefficient of 0.53.

* * * * *